United States Patent [19] [11] 3,767,494
Muraoka et al. [45] Oct. 23, 1973

[54] METHOD FOR MANUFACTURING A SEMICONDUCTOR PHOTOSENSITIVE DEVICE

[75] Inventors: Hisashi Muraoka, Yokohama; Taizo Ohashi, Kanagawa-ken; Toshiko Yasui, Kawasaki; Akihiro Fujii, Kawasaki, all of Japan

[73] Assignee: Tokyo Shibaura Electric Co., Ltd., Kawasaki-shi, Japan

[22] Filed: Oct. 12, 1971

[21] Appl. No.: 187,946

[30] Foreign Application Priority Data
Oct. 15, 1970 Japan ............................... 45/90009

[52] U.S. Cl. .................. 156/17, 148/175, 204/143, 29/572, 29/591, 317/235 N, 317/235 NA, 317/235 NJ, 317/235 NM
[51] Int. Cl. ............................................. H01l 7/50
[58] Field of Search ...................... 156/17; 148/175; 204/143; 29/572, 591; 317/235 N, 235 NA, 235 NJ, 235 NM

[56] References Cited

UNITED STATES PATENTS 3,616,345 10/1971 Van Diik ..................... 204/143 GE
3,616,348 10/1971 Grieg .......................... 204/143 GE

OTHER PUBLICATIONS

Slip & Bowing Control by Advanced Etching Techniques Wenzel Aug. 1967, SCP & Solid State Technology pp. 40–44, See P. 44

*Primary Examiner*—Jacob H. Steinberg
*Attorney*—Solon B. Kemon et al.

[57] ABSTRACT

A method for manufacturing thin semiconductor photosensitive devices having a flat surface comprising the steps depositing a high resistivity silicon epitaxial growth layer on a low resistivity silicon substrate, forming a plurality of PN junctions in the growth layer and etching the substrate to remove the central portion thereof so as to expose the corresponding flat surface portion of the growth layer with an etchant of HF, $HNO_3$ and $CH_3COOH$ which selectively etches the low resistivity silicon without etching the high resistivity silicon.

4 Claims, 6 Drawing Figures

METHOD FOR MANUFACTURING A SEMICONDUCTOR PHOTOSENSITIVE DEVICE

This invention relates to a method for manufacturing a semiconductor photosensitive device having a large number of PN junctions.

Generally, there is employed in an image pickup tube a target using a silicon wafer in which there are formed a large number of PN junctions. In the target of this type, PN junctions are disposed on the side of the silicon wafer which is scanned by electron beams, while a layer of high impurity concentration is formed on the opposite side which is exposed to light. For the purpose of improving the photosensitivity, said light receiving side of the silicon substrate is required to be smoothly formed with high precision, and in order to provided sensitivity to a visible region of light waves, it is desired that a distance between the opposite surfaces of the wafer, that is, the thickness of the wafer, be made small.

However, the conventional manufacturing method has failed to satisfy the aforementioned requirements to a full extent. For example, the mirror surface polishing method is known to be capable of obtaining a most optically flat surface. But application of this method to the above-mentioned thin wafer is practically infeasible due to the resultant damage of the wafer. Further, in order to cause this thin wafer to have mechanical strength to some extent, only the peripheral portion of the wafer should be thick. In this case, the concave portion at the central section has to be polished at the bottom, and any such polishing would be very difficult.

This invention is intended to provide a method of easily manufacturing a semiconductor photosensitive device provided with an epitaxial growth layer in which there are arranged a large number of PN junctions, said growth layer having a very smooth and flat light receiving surface and an extremely small thickness.

Particularly, according to the invention, the semiconductor epitaxial growth layer can be formed extremely as thin as, for example, 5 to 8 $\mu$ which has been considered impossible with the prior art, so that there can be provided a semiconductor photosensitive device having good photosensitivity, particularly to the visible region.

This invention can be more fully understood from the following detailed description when taken in connection with reference to the accompanying drawings, in which.

The present inventors conducted studies and experiments in connection with the etching of a semiconductor element and as a result have found that semiconductor elements having different impurity concentrations are etched at prominently varying rates according to the kinds and compositions of the etchants used.

Figure 1:
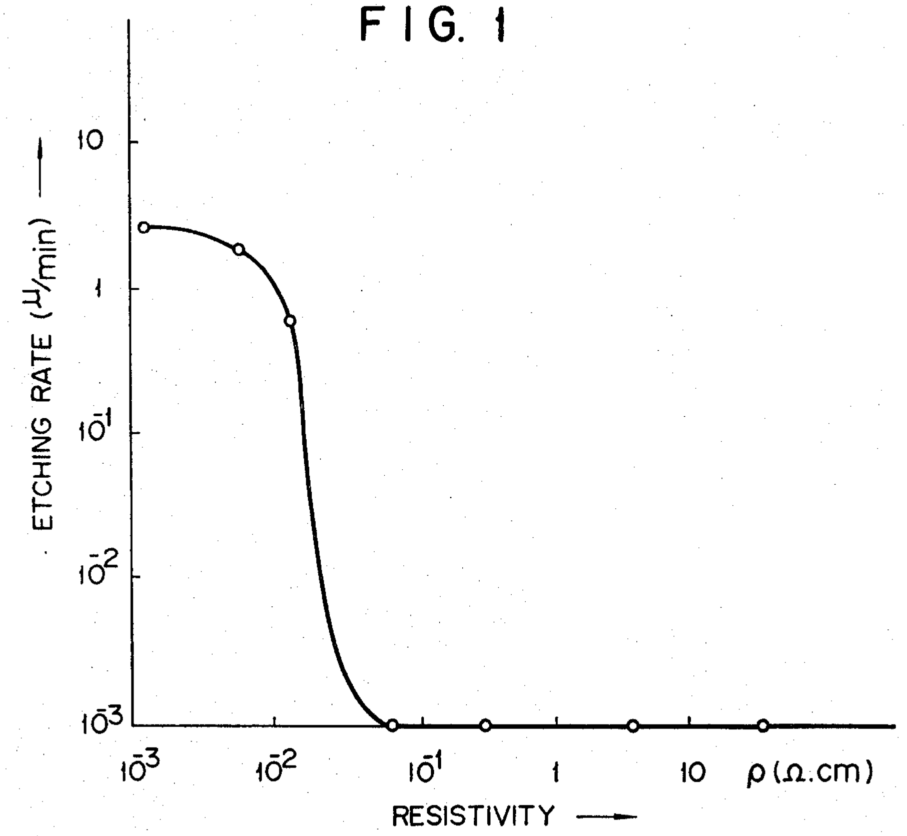
FIG. 1 is a curve diagram of the properties of an etchant used in the manufacturing process of this invention, showing the relationship of the etching rate of said etchant and the resistivity of a silicon substrate.

There will now be described by reference to the appended drawings the developments and results of said experiments. When the acetic acid ($CH_3COOH$) component of an etchant having a ternary system of HF—$HNO_3$—$CH_3COOH$ acting as a decelerating agent was used in increased proportions, the etching rate of the resultant etchant was found to be prominently affected by the resistivity of a silicon element, though it remained unaffected by the conductivity type and crystallographic orientation of said element. As shown in FIG. 1, an etchant consisting of three components of HF, $HNO_3$ and $CH_3COOH$ mixed in the volume ratio of, for example, 1:3:8 indicated an etching rate of 0.7 to 3 $\mu$/min where a silicon element had a resistivity of less than $1.5 \times 10^{-2}$ Ω·cm, whereas the etchant failed to perform etching at all, in case the silicon resistivity was higher than $6.8 \times 10^{-2}$ Ω·cm. Referring to FIG. 1, the etching rate was too minute to determine, where the resistivity was higher than $6.8 \times 10^{-2}$ Ω·cm, so that such rate was taken to be zero.

The foregoing results relate to the case where silicon elements of high and low resistivity were separately etched so as to accurately determine the etching rate. The reason for this separate etching is that where both types of silicon elements were jointly etched by the same etchant, the strong oxidizing action of nitrous acid ($HNO_2$) derived from the etching of the low resistivity silicon allowed the high resistivity silicon to be slightly etched. Determination was made of the rates at which there were jointly etched silicon elements of high and low resistivity or impurity concentration, the results being presented in Table I below.

TABLE I

| $\rho_2$(Ω · cm) \ $\rho_1$(Ω · cm) | 0.068 | 0.30 | 3.2 | 25 |
|---|---|---|---|---|
| 0.0012 | 0.014 | 0.017 | 0.025 | 0.015 |
| | 2.73 | 2.79 | 2.74 | 2.74 |
| .0058 | 0.018 | 0.018 | 0.006 | 0.011 |
| | 1.10 | 1.28 | 1.30 | 1.75 |
| .010 | 0.011 | 0.002 | 0.004 | 0.006 |
| | .79 | .73 | .80 | .79 |

Arsenic (As), antimony (Sb), phosphorus (P) and boron (B) used as impurities in the aforementioned experiments indicated the same results as shown in Table I above.

Table II below shows the results of determining the effects of the conductivity type and crystallographic orientation of a crystallized silicon substrate on the etching rate. As seen from this table, the etchant of this invention had its etching rate little affected by the conductivity type and crystallographic orientation of the substrate.

TABLE II

| | Crystallographic type of silicon | | | |
|---|---|---|---|---|
| p(Ω·cm) | N(100) | N(111) | N(100) | N(111) |
| 0.001 to 0.002 | 2.5 | 2.3 | | |
| 0.006 to 0.008 | 1.9 | | | |
| 0.009 to 0.01 | 1.6 | | | 1.6 |
| 0.01 to 0.015 | 0.62 | 0.75 | | |
| 0.2 to 0.5 | | 0 | 0 | |
| 2 to 5 | | 0 | 0 | |
| 25 to 50 | | | | 0 |

The reason for the above results is assumed to originate with the following fact.

The dissolution of silicon by an etchant of HF-$HNO_3$ is supposed to proceed through the following two-step reaction.

$$Si + 2(O) \rightarrow SiO_2 \qquad (1)$$

$$SiO_2 + 6HF \rightarrow SiF_6^{-2} + 2H_2O + 2H_+ \qquad (2)$$

Further, determination was made of the rates at which silicon elements of high and low resistivity were jointly etched with the temperature of an etchant solution varied, thereby defining "Arrhenius" Energy of Activation.

a. N type (100) 0.002 Ω·cm 5.15 Kcal/mol b. N type (100) 5.0 Ω·cm 12.3 Kcal/mol

The value (a) above represents the reaction formula (2), that is, the case where diffusion process is rate determining. The value (b) denotes the reaction formula (1), that is, the case where the oxidation process of HF is rate determining. With a high resistivity silicon element, oxidation is a rate determining factor with the resultant slow etching rate, and with a low resistivity silicon element, the diffusion of HF is a rate determining factor to permit quick etching.

Figure 2:
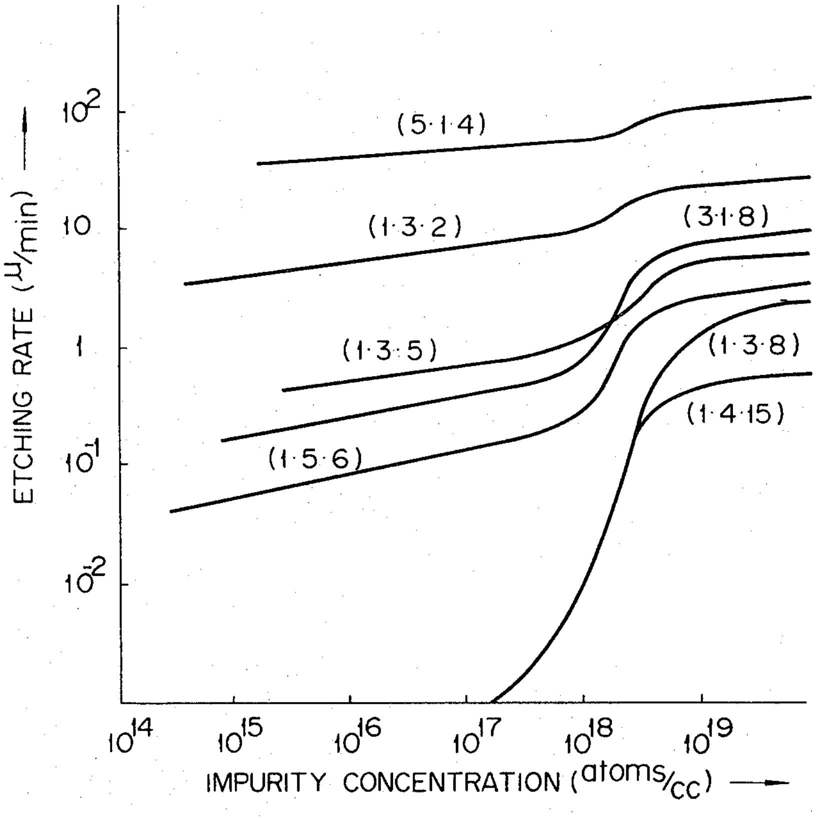
FIG. 2 is a curve diagram of the relationship of the etching rate of an etchant consisting of hydrogen fluoride (HF), nitric acid ($HNO_3$) and acetic acid ($CH_3COOH$) and the impurity concentration of a silicon substrate, where the proportions of these components were varied.

The foregoing results of determination were obtained with an etchant consisting of three components of HF, $HNO_3$ and $CH_3COOH$ which were compounded in the ratio of 1:3:8. When its composition is varied, an etchant of such a ternary system indicates, as shown in FIG. 2, prominently different etching rates with respect to silicon elements having high and low impurity concentrations. In FIG. 2, the different impurity concentrations of silicon elements are plotted on the abscissa and the etching rates on the ordinate, where said silicon elements were etched by etchants of a ternary system whose components were mixed in varying proportions. FIG. 2 shows that regardless of its composition, said ternary system etchant generally presented a sharp increase in the etching rate when the impurity concentration of a silicon element approached $10^{18}$ to $10^{19}$ atoms/cm$^3$, and that the extent of said increase was considerably varied according to the composition of the etchant actually used. The etching rate of a ternary system etchant consisting of HF, $HNO_3$ and $CH_3COOH$ compounded in the ratio of, for example, 1:3:8 (denoted by the (1·3·8) curve indicated a sudden rise at the aforesaid impurity concentration of $10^{18}$ to $10^{19}$ atoms/cm$^3$, but presented no noticeable increase at higher impurity concentrations. In contrast, etchants having ternary compositions whose components were mixed in the ratios of 5:1:4 and 1:3:2 (represented by the (5·1·4) and (1·3·2) curves respectively) showed little variation in the etching rate at the above-mentioned impurity concentration.

As mentioned above, an etchant comprising a ternary system of HF—$HNO_3$—$CH_3COOH$ in which $CH_3COOH$ has a prominently large proportion presents different etching rates with respect to jointly used silicon elements of high and low impurity concentrations. The etching rate for a silicon element of high impurity concentration is practically preferred to be over 10 times quicker than that for a silicon element of low impurity concentration. If the difference between said etching rates falls to above said ratio, the object of this invention will now be fully attained. It has been experimentally found that the ternary composition of an etchant capable of realizing the preferred etching rate ratio should fall within the hatched region of FIG. 3. The preferred range of the ternary composition represented by said hatched region was determined by simultaneously etching an N type silicon element of (100) crystallographic orientation having a resistivity of 0.008 Ω·cm and that having a resistivity of 5 Ω·cm with the same etchant. Ratios of HF, $HNO_3$ and $CH_3COOH$ in said hatched region which determine the boundary condition are 5:50:45, 20:20:60, 25:8:67, 15:5:80, 5:20:75 and 2:40:58.

When determination was made of the etching rate of the aforementioned etchant whose ternary composition has a ratio of 1:3:8, said etching rate was found to be as small as 0.025 μ/min with respect to a layer of silicon oxide. This etching rate only accounts for about one-thirtieth to one-hundredth of that for a low resistivity silicon element. It will be apparent, therefore, that the etchant of this invention only dissolves a low resistivity silicon element, but does not substantially etch a high resistivity silicon element and an insulating layer made of, for example, silicon oxide, silicon nitride and aluminum oxide. Three components of HF, $HNO_3$ and $CH_3COOH$ in the etchant used in the present invention are respectively solutions of 49, 70 and 99.5 percent.

There will now be described a method for manufacturing a semiconductor photosensitive device according to an embodiment of the invention with reference to FIGS. 4A to 4C.

Figure 4A:
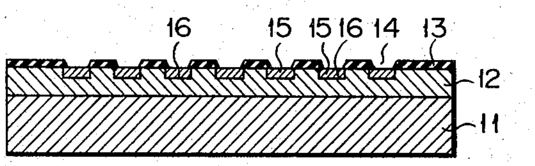
FIGS. 4A to 4C illustrate the sequential steps of an embodiment of the invention.
Figure 4B:
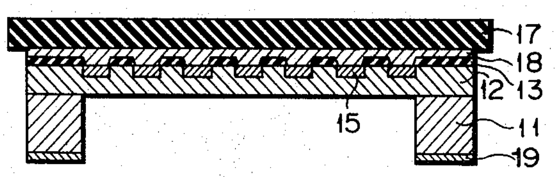
Figure 4C:
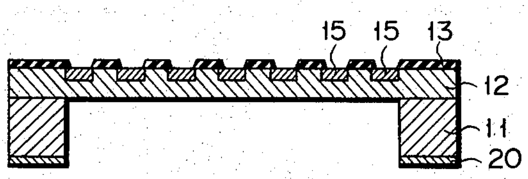

As shown in FIG. 4A, on an arsenic doped silicon substrate 11 of $N_+$ conductivity type having an impurity concentration of approximately $1 \times 10^{19}$ atoms/cm$^3$ there is formed an epitaxial growth layer 12 which is doped with an impurity such as phosphorous to have a lower concentration than said substrate, for example, a concentration of $1 \times 10^{15}$ atoms/cm$^3$. At this time, the layer can be controlled to a prescribed thickness by the conditions of the epitaxial growth method. All over said layer 12 there is further formed a silicon dioxide film 13, for example, by high temperature oxidization or thermal decomposition of silane and in said film 13 are then formed a large number of through holes 14 in the form of an array by photo-engrossing. By a selective diffusion method boron is diffused into the epitaxial growth layer through the holes to form therein island regions 15 of P conductivity type whereas a large number of PN junctions 16 are found between said island regions 15 and the layer 12. As shown in FIG. 4B, the silicon layer 12 is supported from the side of the silicon dioxide film 13 by a supporting plate 17 made of, for example, quartz or fluorine-contained resins through a wax 18 and the silicon substrate 11 is coated with a protection wax 19 at the peripheral edge of the opposite side. The exposed portion of said substrate 11 is etched off with the above-mentioned etching solution consisting of HF, $HNO_3$ and $CH_3COOH$ bearing the volume ratio of 1:3:8 to expose the central section of the layer 12. At this time, only the substrate 11 of low resistivity silicon is etched and not the growth layer 12 of high resistivity silicon. Resultantly, the layer 12 is caused to have a smooth and flat exposed face portion and has substantially the same thickness as realized when it is grown. Where said etching treatment is carried out for a long time, there occurs the possibility that a large amount of $HNO_2$ is generated to cause the high resistivity layer 12 to be etched at a faster rate than required.

But in this case, there has only to be added to the etchant an $HNO_2$ removing agent, for example, $NaN_3$ for decomposing it into $N_2$ gas or $H_2O_2$ for oxidizing said $HNO_2$. Finally, as shown in FIG. 4C, the waxes 18 and 19 as well as the supporting plate 17 are removed and an electrode 20 is formed at the plate where the wax 19 has been removed, thus providing a semiconductor photosensitive device or target.

Figure 3:
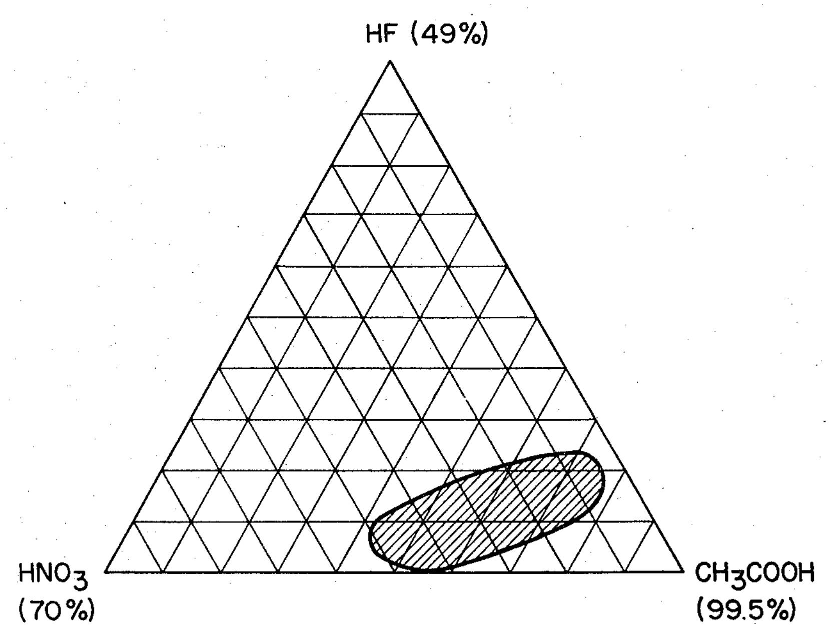
FIG. 3 is a triangular chart showing the preferred proportions of the three components of HF, $HNO_3$ and $CH_3COOH$ constituting the etchant used in the manufacturing process of this invention.

What we claim is:

1. A method for manufacture of a semiconductor photosensitive device which comprises:

a. forming an epitaxial growth silicon layer having an impurity concentration of less than $10^{17}$ atoms/cc of predetermined thickness on one side of a silicon substrate having an impurity concentration of more than $10^{18}$ atoms/cc, b. forming a plurality of PN junctions in said epitaxial growth silicon layer, c. forming a protective layer on the peripheral portion of said substrate on the side of the substrate opposite to said one side, d. etching said substrate not covered by said protective layer to expose the flat side of said epitaxial growth silicon layer with an etchant consisting essentially of HF, $HNO_3$ and $CH_3COOH$ which selectively etches the silicon substrate without substantially etching the epitaxial growth silicon layer wherein the content of HF, $HNO_3$ and $CH_3COOH$ of said etchant is within the shaded area of FIG. 3 of the annexed drawing.

2. The method of claim 1 wherein the etching rate of said substrate is more than 100 times the etching rate of said silicon layer.

3. The method of claim 1 wherein said protective layer is formed of a wax.

4. The method of claim 1 wherein said protective layer is removed from the substrate beneath it following said etching step (d) and an electrode is formed on the substrate where the protective layer was removed.

* * * * *